(12) United States Patent
Aoki

(10) Patent No.: US 6,576,981 B1
(45) Date of Patent: Jun. 10, 2003

(54) REDUCED PARTICULATE ETCHING

(75) Inventor: Katsumi Aoki, Troutdale, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/898,267

(22) Filed: Jul. 3, 2001

(51) Int. Cl.⁷ ............................................. H01L 23/58
(52) U.S. Cl. ..................... 257/632; 257/629; 257/640
(58) Field of Search ................. 257/629, 632, 257/646

(56) References Cited

U.S. PATENT DOCUMENTS

| | | | | |
|---|---|---|---|---|
| 5,164,344 A | * | 11/1992 | Zank ............................ | 501/90 |
| 5,200,157 A | * | 4/1993 | Toya et al. ................. | 433/246 |
| 5,670,253 A | * | 9/1997 | Chiu et al. ................... | 428/336 |
| 5,885,356 A | * | 3/1999 | Zhao et al. .................. | 118/723 |
| 5,910,221 A | * | 6/1999 | Wu ........................ | 118/723 R |

FOREIGN PATENT DOCUMENTS

JP  35-6147756  * 11/1981  ......... C07C/126/02

* cited by examiner

Primary Examiner—Amir Zarabian
Assistant Examiner—Pamela E Perkins
(74) Attorney, Agent, or Firm—Luedeka, Neely & Graham, PC

(57) ABSTRACT

A platen for use in a dry etching process for substrate production, the platen having a surface susceptible to chipping and/or particle generation from the dry etching process and a coating applied to at least a portion of the surface for rendering the surface less susceptible to chipping and/or particle generation, the coating comprising a silicon carbide coating

1 Claim, 1 Drawing Sheet

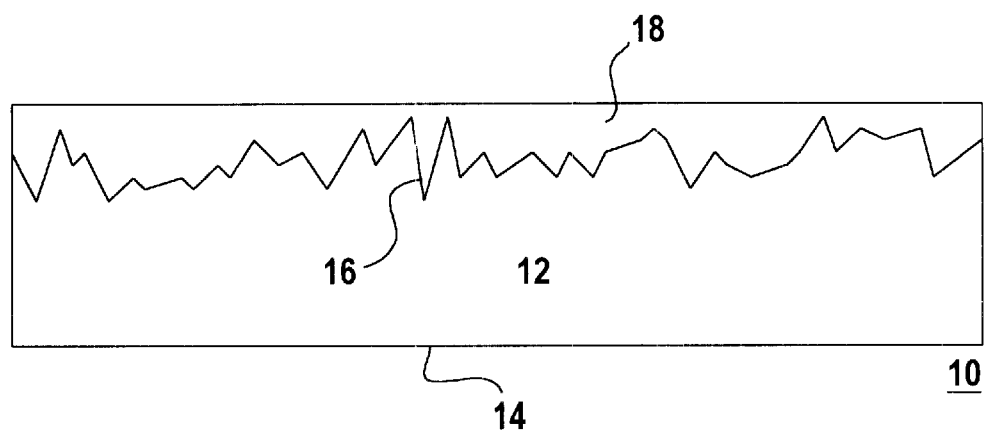

REDUCED PARTICULATE ETCHING

FIELD

This invention relates to the field of integrated circuit manufacturing. More particularly the invention relates to the treatment of platens for rendering them more useful in dry etching processes.

BACKGROUND

It is desirable to reduce extraneous particulate matter in the environments in which integrated circuits are processed. One reason for this is that when airborne particles are deposited on the surface of the substrate on which the integrated circuits are formed, the particles tend to create processing defects in the integrated circuits, thus reducing the yield of the process and increasing the manufacturing costs of the integrated circuits.

One method by which particles are generated during processing is by the degradation of a surface in a reaction chamber. For example, ceramic materials tend to be highly favored in certain types of reaction chambers because, among other things, they tolerate heat and tend to be non reactive in many environments. However, many ceramic materials tend to have relatively rough surfaces and relatively large pores which crack and spall relatively easily, thus creating particles. In some processes, where gases are distributed though the system, the particles thus created may become entrained in the flowing gases and redeposited on the substrates being process.

For example, dry etching is one method used to form integrated circuits on a substrate, such as a semiconductor substrate. In dry etching processes, such as reactive ion etching, an etching gas is introduced by a gas distribution plate into an etching chamber containing the substrate. One problem encountered in such processes is chipping or degradation of the gas distribution plate, which generate particulates of the plate material. These particles from chipping or other degradation of the plate are carried by the etching gas to the substrate and tend to be detrimental to the integrity and quality of the semiconductor substrate, as described above.

What is needed, therefore, is a system by which gas distribution plates are less susceptible to chipping and generation of particles so as to provide gas distribution plates which are more suitable for their intended purpose.

SUMMARY

The above and other needs are met by an improved platen for use in a dry etching process for substrate production. In a preferred embodiment, surfaces of the platen that are susceptible to chipping and particle generation from the dry etching process are coated with silicon carbide to render such surfaces less susceptible to chipping and particle generation. The coating is preferably applied to a thickness of at least about sixty microns by chemical vapor deposition.

It has been observed that the coating is particularly suitable for coating ceramic silicon dioxide distribution plates. Such plates are desirable from a cost basis, but are fragile and prone to chipping and particle generation. By coating the plates in accordance with the invention, the plate is rendered less prone to chipping and particle generation without unduly affecting the desirable cost attributes of the plates. Thus, the invention advantageously enables improved performance in an economical manner.

BRIEF DESCRIPTION OF THE DRAWING

Further advantages of the invention are apparent by reference to the detailed description when considered in conjunction with the FIGURE, which is not to scale so as to more clearly show the details, and which depicts a platen according to the present invention.

DETAILED DESCRIPTION

With reference to FIG. 1, there is depicted a preferred embodiment of a platen, such as gas distribution plate 10, in accordance with a preferred embodiment of the invention. The plate 10 preferably includes a base plate member 12 having a configuration suitable for distributing gas in a dry etching process, with a thickness defined between opposite substantially planar surfaces 14 and 16.

In a preferred embodiment, the base plate member 12 is made of ceramic silicon carbide. Such plates are desirable in that they are relatively inexpensive, but tend to be relatively fragile. Further, the surface of plates formed from such ceramic materials tends to be rather rough, which roughness provides points that are relatively easily fractured from the surface of the base 12, such as by thermal or mechanical stresses. As a result, such plates tend to chip during the etching process such that particles of the plate material are generated and carried to the substrate during the etching process. This undesirably affects the etching process and may affect the quality of the substrate.

In accordance with the invention, it has been discovered that significant reductions in the chipping of the plates and the generation of particles may be achieved by applying to at least a portion of the plate member 12, such as the surface 16, a coating 18. In a preferred embodiment, the coating 18 is a film of silicon carbide having a thickness of at least about sixty microns. The silicon carbide material for the coating 18 is preferred, because it tends to be nonreactive to many processes, such as dry etching processing. However, it is appreciated that other relatively nonreactive materials that are compatible with the materials, processes, and intended functions as described herein may also be used. It is understood that the coating 18 may additionally applied to other surfaces of the plate member 12 such as the surface 14 and the side edges of the plate 12.

A preferred method for coating the plate member 10 includes the following steps. Most preferably, the edges of the base plate member 12 are chamfered to reduce relatively sharp edges. In a cleaning step, the plate is first cleaned using an acid solution and ultrasonic treatment. A preferred acid solution is hydrofluoric acid, in a concentration of from about five percent to about ten percent. After the cleaning step, the plate is dried in an oven, preferably at a temperature of from about one hundred centigrade to about two hundred centigrade, for a time of from about six hours to about twelve hours. Next, the coating 18 is applied, preferably as by chemical vapor deposition.

Application of the coating by chemical vapor deposition is particularly preferred because the coating is applied in a highly conformal manner, and the coating is deposited as a relatively dense layer. Further, the surface of the coating is preferably relatively smooth, and preferably does not have small cusps or other protrusions that would tend to easily be chipped away from the surface of the coating and become airborne, such as in a process where a gas delivery system is used, and in a portion of the process reactor where such chips would tend to become lofted in gases and swept through other portions of the reactor. Further, chemical vapor deposition tends to produce a film with relatively large grains, which further tends to increase a deposited films resilience to chipping.

The chemical vapor deposited coating 18 tends to fill in any cracks that are present in the base member 12, as well as generally seal the surface of the base member 12. Although a platen comprised entirely of a vitreous material also tends to have reduced particulate generation, such platens are quite expensive. A platen 10 formed according to the method as described herein provides the benefits of reduced particulate generation and reduced cost of manufacture.

The thickness of the coating 18 is preferably selected, at least in part, based upon the surface roughness or porosity of the base member 12. For example, a surface 16 that is rougher or has larger pores is preferably given a thicker coating of the sealing material 18, so as to encase all of the points of the rough surface and fill the pores of the base member 12. On the other hand, a base member 12 with a smoother surface and smaller pores, even though still fragile and prone to cracking, may preferably receive a thinner coating, which is sufficient to encase the points of the smoother surface and seal whatever cracks and pores may be present.

In a most preferred embodiment, the base member 12 is formed of ceramic silicon carbide having a density of from about sixty percent to about eighty percent, and the coating 18 has a density of at least about ninety-nine percent.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A surface for use in a dry etching process, the surface comprising:

a silicon carbide base layer having a density of between about sixty percent and about eighty percent, the base layer having chamfered edges, and a silicon carbide coating disposed on at least a portion of an exposed surface of the silicon carbide base layer, the silicon carbide coating having a density of at least about ninety-nine percent, and a thickness of about sixty microns, the silicon carbide coating thereby sealing the exposed surface of the silicon carbide base layer, and reducing particle generation from the silicon carbide base layer during the dry etching process.

* * * * *